United States Patent [19]
Connell

[11] Patent Number: 5,875,197
[45] Date of Patent: Feb. 23, 1999

[54] ADDRESSABLE SERIAL TEST SYSTEM

[75] Inventor: Lawrence Edwin Connell, Naperville, Ill.

[73] Assignee: Motorola Inc., Schaumburg, Ill.

[21] Appl. No.: 441,560

[22] Filed: May 15, 1995

[51] Int. Cl.$^6$ .................................................. G01K 31/28
[52] U.S. Cl. ........................................................ 371/22.31
[58] Field of Search ............................... 371/22.3, 22.31, 371/22.32, 22.34

[56] References Cited

U.S. PATENT DOCUMENTS

| | | |
|---|---|---|
| 4,697,267 | 9/1987 | Wakai . |
| 4,701,921 | 10/1987 | Powell et al. . |
| 4,710,931 | 12/1987 | Bellay et al. . |
| 4,710,933 | 12/1987 | Powell et al. . |
| 4,728,883 | 3/1988 | Green . |
| 4,780,874 | 10/1988 | Lenoski et al. . |
| 4,821,290 | 4/1989 | Hingorani et al. . |
| 4,853,929 | 8/1989 | Azuma et al. . |
| 4,855,670 | 8/1989 | Green . |
| 4,862,072 | 8/1989 | Harris et al. . |
| 4,947,357 | 8/1990 | Stewart et al. . |
| 5,153,882 | 10/1992 | Lyon et al. . |
| 5,229,999 | 7/1993 | Cushing et al. . |
| 5,271,019 | 12/1993 | Edwards et al. ..................... 371/22.3 |
| 5,347,523 | 9/1994 | Khatri et al. . |

OTHER PUBLICATIONS

Thomas W. Williams, Kenneth P. Parker, "Design for Testability—A Survey," *Proceedings of the IEEE*, vol. 71, No. 1, Jan. 1983.

*Primary Examiner*—Albert Decady
*Attorney, Agent, or Firm*—Nicholas C. Hopman

[57] ABSTRACT

An addressable serial test system employs a serial register with parallel outputs. Data is clocked into the serial register via a shift clock signal. A decoder is connected to a portion of the shift register's outputs and provides a selection signal dependent on the data clocked into the serial register. A system clock generates a system clock signal. A storage element includes a clock input coupled to the system clock signal, a data input, an output, a load input coupled to the selection signal, and a test data input coupled to another portion of the shift register's outputs. The storage element's output is alternately forced to a state indicative of the test data input by the selection signal and forced to a state indicative of the data input by the system clock. Structure is included to configure the serial register to read the contents of the storage element.

7 Claims, 3 Drawing Sheets

ADDRESSABLE SERIAL TEST SYSTEM

FIELD OF THE INVENTION

This invention is generally directed to the field of electronic testing, and is particularly useful in constructing size efficient and powerful test structures for testing digital integrated circuits.

BACKGROUND OF THE INVENTION

Contemporary digital circuit test systems often employ a structure named Scan Path. Scan Path is a useful structure that enables testing of a wide variety of digital circuits and systems. In a Scan Path arrangement normally autonomously operated circuit storage elements, such as flip-flips, latches, and other memory capable devices, are reconfigured into a coupled structure - in effect concatenated in series to form a new circuit. Once the normally autonomously operated circuit storage elements are arranged in series a test clock can be used to clock out the states of the memory elements. These clocked-out states can be externally analyzed to determine the correct operation of the digital circuit. Conversely, the test clock can clock in new states and sometime later, after the digital circuit operates on the forced data states, the states of the scan-path arranged storage elements can be readout. This approach is particularly interesting because a large scale system or circuit can be tested with very few additional input-output connections. This is particularly important in integrated circuit design where pins are always expensive.

However, the Scan Path approach has several inherent problems that include primarily complexity and speed of operation. Regarding complexity, each testable concatenatable storage element must be constructed in such a way that it can function as normally expected and also function as a testable element. This requires a significant investment in complexity of the storage element. In order to enable the storage elements to be threaded together, the storage elements structurally are two or three times as complex as simple latches.

Secondarily, the speed of interrogation of the Scan Path is dependent on the size of the concatenated structure. To be circuit complexity efficient these Scan Path structures are relatively large. Also, if only a few storage elements need to be tested the whole Scan Path must be filled or dumped because storage elements are not individually addressable. To increase the throughput of the interrogation prior art schemes have broken the Scan Path structure into more than one Scan Path structure. Although this will increase the testing speed it adversely adds to the circuit's complexity.

What is needed is an improved structure for testing digital circuits that is less complex, and can operate at a higher speed.

DETAILED DESCRIPTION OF A PREFERRED EMBODIMENT

An addressable serial test system employs a serial register with parallel outputs. Data is clocked into the serial register via a shift clock signal. An address decoder is connected to a portion of the shift register's outputs and provides a selection signal dependent on the data clocked into the serial register. A system clock generates a system clock signal. A storage element includes a clock input coupled to the system clock signal, a data input, an output, a load input coupled to the selection signal, and a test data input coupled to another portion of the shift register's outputs. The storage element's output is alternately forced to a state indicative of the test data input by the selection signal and forced to a state indicative of the data input by the system clock. Structure is included to configure the serial register to read the contents of the storage element. Furthermore, a plurality of storage elements can be addressably written to or read from using the described structure.

The described approach departs significantly from the prior art schemes because the scan path in-effect is now the addressable serial register. Scan paths can be kept short and therefore the test speed can be increased over traditional scan path schemes. Also, the additional structure to allow addressable selection of various subsystems and individual elements in the system under test is minimal.

Certain inventive aspects of the new structure may be better appreciated through a review of the accompanying figures.

Figure 1:
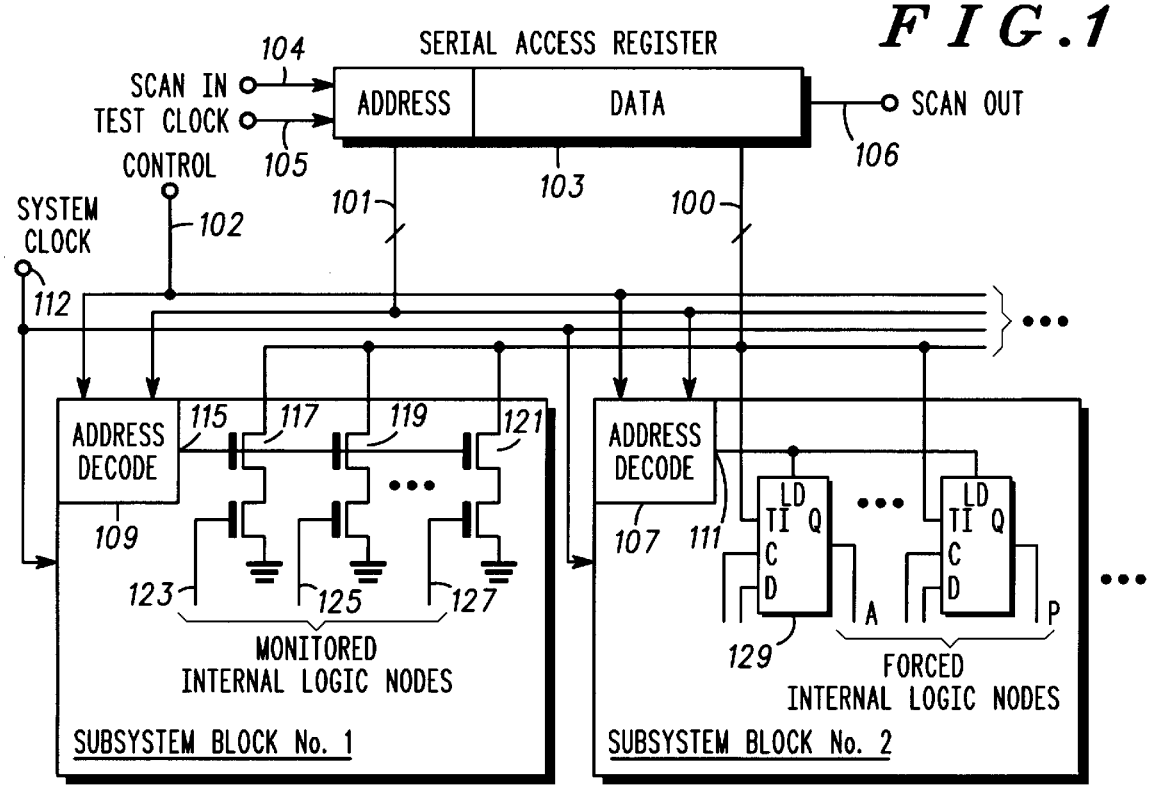
FIG. 1 is a system block diagram illustrating a general configuration in accordance with a preferred embodiment of the invention.

FIG. 1 is a system block diagram illustrating a general configuration of an addressable serial test system in accordance with a preferred embodiment of the invention. Serial shift, or serial access register 103 is used to serially transfer both address and data for both controlling and observing internal logic nodes of a digital system depicted. In one mode of operation, a data stream containing address and data information is serially applied to scan input 104 and clocked into register 103 with each positive transition of a test clock 105. Once register 103 is loaded, the address information is applied to address bus 101, while forcing data is applied to a global bi-directional data bus 100.

The address is used to specify which subset of a multiplicity of subsets of the internal logic nodes are to be selected, while the data is used to force or program the state of those nodes selected. The nodes may be constructed of various forms of storage elements including latches, flip-flops, and other forms of memory elements.

The address information contains a write bit which is used to determine if data is to be written to or read from the selected subset of internal nodes. When the write bit is enabled, a write operation is performed and the received data which was serially scanned into register 103 is used to force the state of the selected group of internal nodes. When the write bit is disabled, a read operation is performed and state of the selected internal nodes is transferred to register 103 and serially scanned out at scan output 106. Note that the data portion of the serial register 103 is bi-directional allowing the mentioned parallel writes and reads when selected.

Address decoding logic 107 and 109 is remotely distributed throughout the digital system and located near each subset of internal nodes to be selected. Subsystem block 2 depicts a subset of internal storage nodes A through P which can be loaded with forcing data applied to data bus 100. Subsystem block 2 is representative of a state controller whose state is stored in storage elements A through P. During normal system operation, storage elements A through P operate as simple D flip-flops with a D data input, a C clock input, and a Q output.

During a test mode of operation, storage elements A through P are written by first serially loading register 103 with the write bit enabling the unique address used to activate address decoder 107 and select subsystem block 2, and the desired data to be used to force storage elements A through P. Once register 103 is loaded, the received address and data is applied to address bus 101 and data bus 100 respectively. Control input 102 is then enabled and address decoder output 111 is activated. Address decoder output 111 is applied to asynchronous load control input LD of storage elements A through P. When activated, input LD will then cause the forcing data applied to test inputs TI through data bus 100 to be asynchronously loaded in parallel into storage elements A through P. The term asynchronous is used to indicate that the storage elements can be loaded independent of the state of a system clock signal 112 or a derivative thereof applied to the clock input C of storage elements A–P. This feature advantageously provides increased flexibility in specifying input test stimulus for asynchronously clocked systems. An example of a transistor level implementation of the storage elements A–P is shown in FIG. 2 and will be described later.

In FIG. 1, subsystem block 1 depicts a set of internal nodes whose status can be externally monitored at serial scan output 106. During the test mode, a read operation is performed by first serially loading register 103 with a disabled write bit and the unique address used to activate address decoder 109 and select subsystem block 1. Once register 103 is loaded, the received address is applied to address bus 101. Next, control input 102 is enabled and address decoder output 115 is activated. Address decoder output 115 is applied to N channel transistors 117, 119 and 121. When transistors 117, 119 and 121 are enabled, the inverted state of internal logic signals 123, 125 and 127 is then loaded onto bi-directional data bus 100. Data bus 100 is a precharged data bus, and is precharged high prior to loading. Once loaded onto data bus 100, the data is then transferred in parallel into register 103 to be serially scanned out at scan output 106.

By providing an independent test clock input 105, the shift register 103 can be clocked independently of the normal operating system clock 112 and a snap-shot of the digital system can be obtained during any system clock cycle. Also, the state of the digital system can be arbitrarily forced during any system clock cycle as well.

Figure 2:
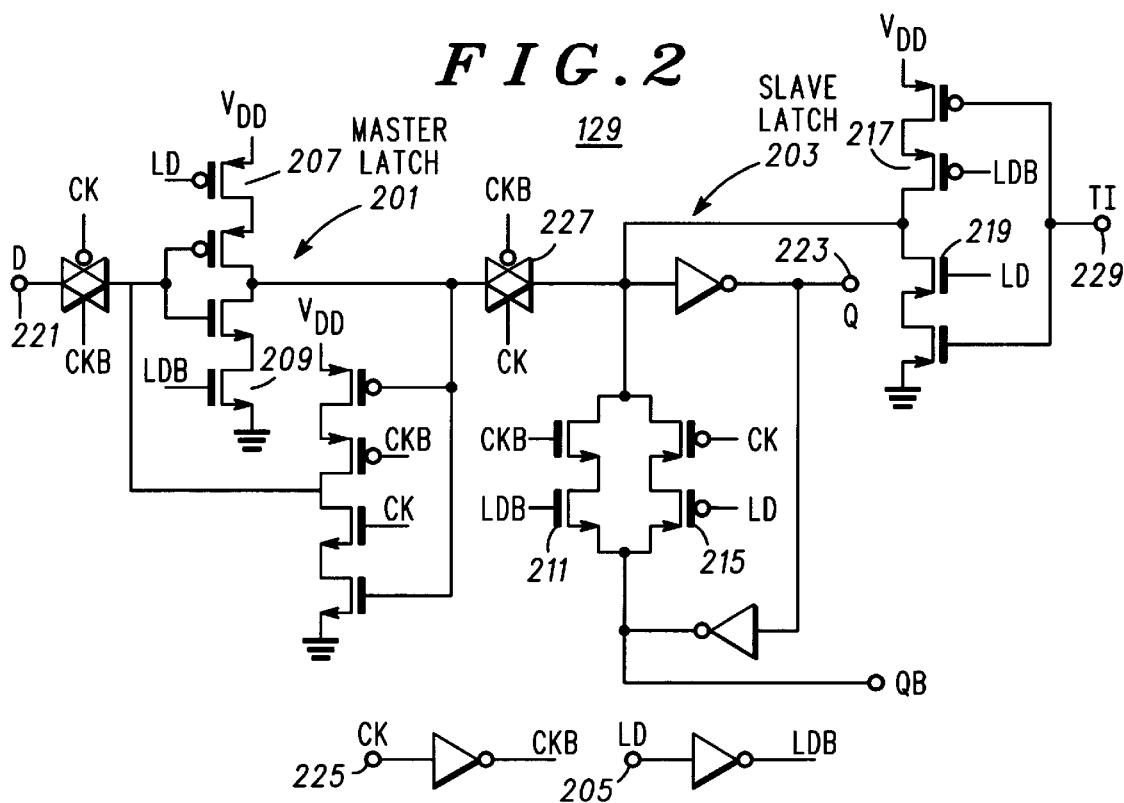
FIG. 2 is a schematic block diagram showing details of a flip-flop introduced in FIG. 1.

The storage element 129 of FIG. 1 is shown in detail in FIG. 2. Element 129 comprises master latch 201 and slave latch 203. During normal system operation, LD input 205 is set to a logical low state, turning on transistors 207, 209, 211 and 215 while turning off transistors 217 and 219. While the LD input 205 is set low, element 129 operates as a well known D flip-flop where the state of D input 221 is transferred to Q output 223 when a positive input transition occurs at clock input 225. When the LD input is set high, the TI test input 229 is enabled by turning on devices 217 and 219 while turning off transistors 207, 209, 211 and 215. With the LD input 205 set high, the state of TI test input 229 is loaded into element 129 and transferred to Q output 223 independent of the state of clock input 225. When the LD input 205 goes low, storage element 129 will remain in its asynchronously loaded state until the next positive transition occurs at clock input 225. In comparison to a standard D flip-flop with a reset, storage element 129 only requires an additional 4 transistors or approximately 20% more area.

Figure 3:
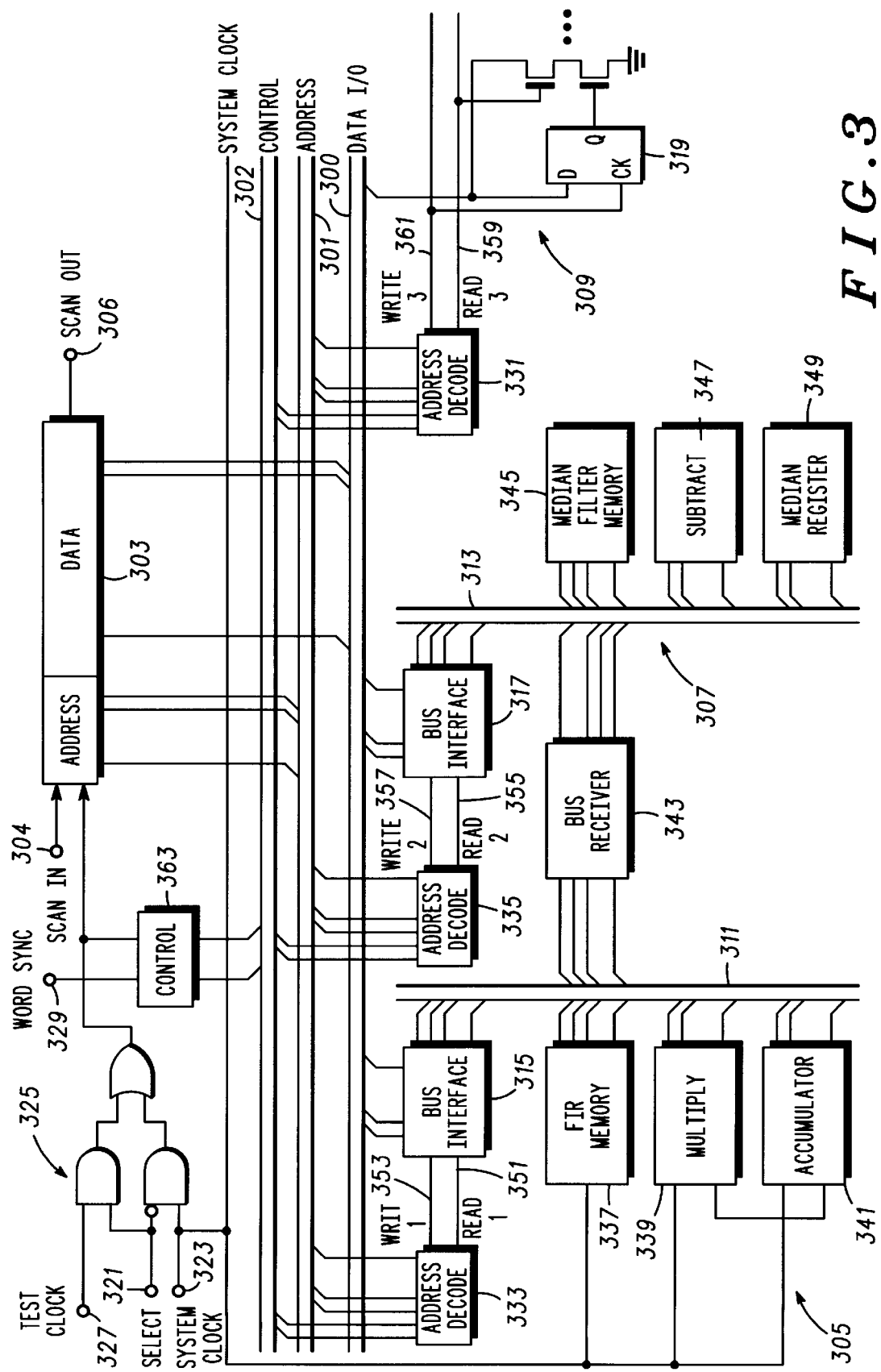
FIG. 3 is another system block diagram illustrating further details of various subsystems addressable using the configuration introduced in FIG. 1.

A second embodiment of the addressable serial test system is depicted in FIG. 3. In FIG. 3, serial access register 303 is shown as being configurable for use in both a test mode, as well as a normal system operating mode. Also shown are three new subsystems 305, 307 and 309.

Subsystems 305 and 307 each contain an internally embedded data I/O bus 311 and 313 which are each accessible during test through respective bus interfaces 315 and 317. Subsystem 309 is representative of a system control register 319, wherein control register 319 is used to control system operation and which can be either written to or read from during a normal system operating mode.

A select input 321 is used to select either the test or system operating mode. The system operating mode is selected by forcing input 321 logically low and enabling a clock selection circuit 325 to select a system clock input 323 to clock register 303.

Test mode is selected by forcing select input 321 high and configuring clock selection circuit 325 to select test clock input 327 to clock register 303.

The utilization of clock selection circuit 325 provides the addressable serial test system with a very significant cost advantage over the prior art. This results from the added capability to now share the cost of the serial register 303 and its associated parallel address bus 301 and data I/O bus 300 between both the test and system function. Further, with the increasing use of multiple layers of metal interconnect in many integrated circuit processes, much of the interconnect can now be routed over the cell logic and is therefore realizable with a minimal impact in area and expense.

During system operation, a data stream containing system control address and data information is serially applied to scan input 304 and clocked into register 303 with each positive transition of system clock 323. Upon loading register 303, the address information is applied to address bus 301, while system control data is applied to data I/O bus 300.

A word sync input 329 is used to identify the word boundary and signal when register 303 has been loaded with each new control word. In turn, the selected control register is enabled. Either a write or a read operation is performed as determined by the state of a write bit contained within the address.

Test mode is entered by setting test input 321 to a logically high level. In test mode, a data stream, which now contains address and data information for test, is applied to scan input 304, while register 303 is clocked with each positive transition of test clock input 327. Once register 303 is loaded, word sync input 329 is then enabled and the selected address decoder is activated.

In FIG. 3, address decoders 333 and 335 are shown to enable access of the internally embedded data I/O buses 311 and 313, respectively. Data I/O bus 311 is a data interface internal to subsystem 305 and used to transfer data between circuit blocks 337, 339 and 341. Subsystem 305 functions as a FIR filter and operates on time sampled input data applied to data I/O bus 311. Subsystem 305 then produces filtered output samples which are also applied to data I/O bus 311 to be transferred through bus receiver 343 to subsystem 307 for further processing. Subsystem 307 performs a median filter function and uses internally embedded data bus 313 to communicate between circuit blocks 345, 347 and 349.

Figure 5:
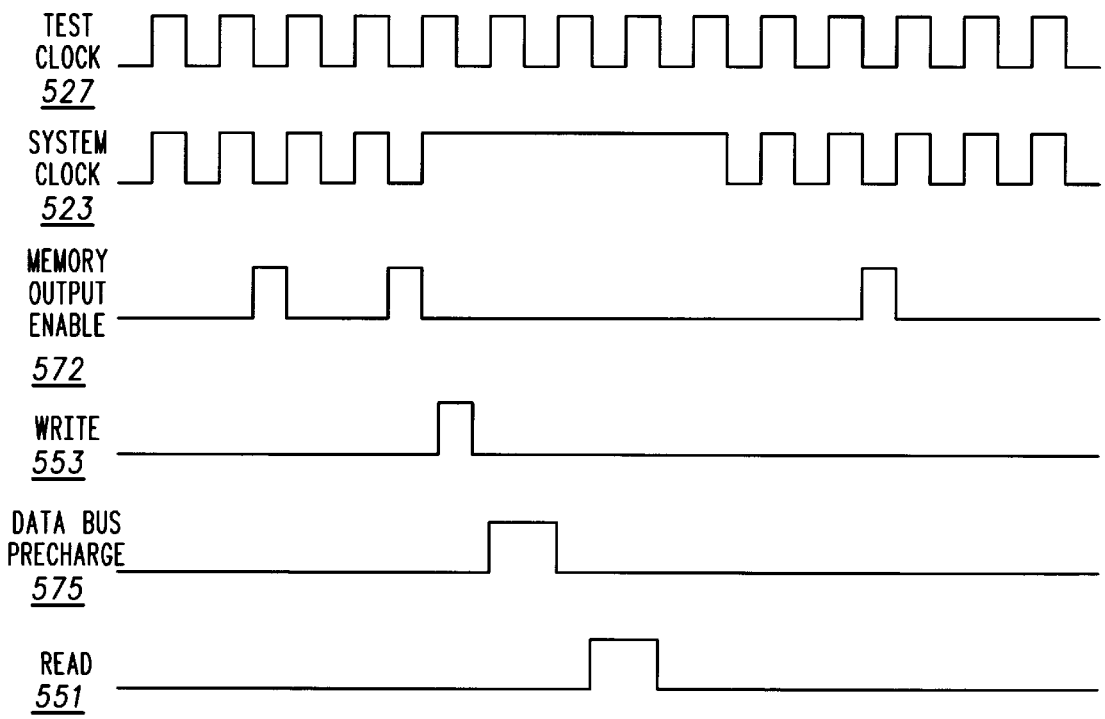
FIG. 5 is a timing diagram illustrating details of the operation of the circuit shown in FIG. 3.

Subsystem 305 is tested by sequencing the system clock 323 to exercise circuits blocks 337, 339 and 341. Since a significant amount of data is communicated between blocks using data bus 311, write and read test operations are performed on data bus 311 at certain system clock cycles in order to either force or check specific intermediate filter calculations. Write and read operations for data bus 311 are performed according to the timing diagram as shown in FIG. 5. All of the circuits blocks 337, 339, and 341 are designed to only drive data bus 311 when system clock 323 is low. Accordingly, the FIR memory 337 output enable waveform 572 is shown as only being active high when system clock input 323 is low. In order to prevent bus contention, writes to data bus 311 through bus interface 315 are performed with the system clock held high while all other circuit block bus drivers are guaranteed inactive. In compliance with the above, a typical write waveform 553. Is shown in FIG. 5. A typical read waveform 551 for performing a read operation of data bus 311 is also shown in FIG. 5.

During a read operation, the inverted state of data bus 311 is loaded onto data bus 300 through bus interface 315 by activating Read 1 signal 351. Data bus 300 is a precharged bus. Accordingly, a typical data bus precharge waveform pulse 575 is shown immediately preceding the READ waveform pulse 575 in FIG. 5. The timing relations shown in FIG. 5 for the WRITE, READ, and PRECHARGE waveforms are generated using a control circuit 363. A read and write of data bus 313 are performed similarly to that described above for data bus 311.

Figure 4:
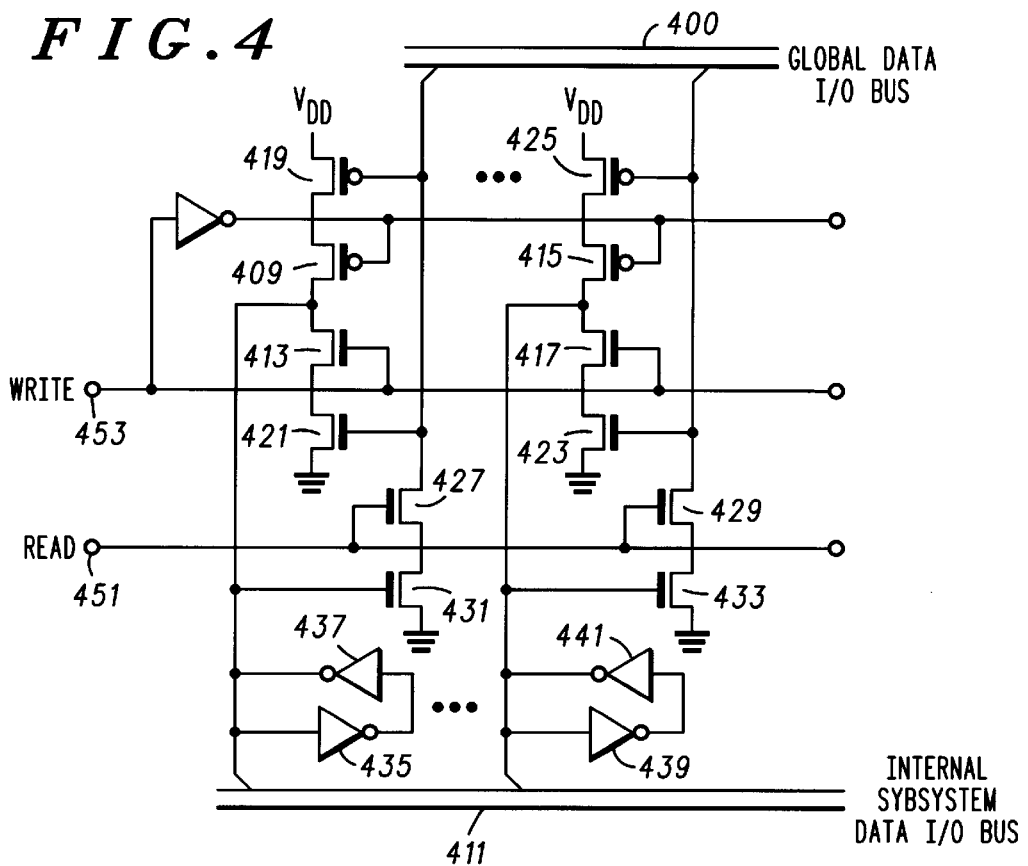
FIG. 4 is a schematic block diagram showing details of a bus interface circuit introduced in FIG. 3.

FIG. 4 is a detailed schematic of bus interface circuits 315 and 317. When write input 453 is activated, transistors 409, 413, 415 and 417 are turned on and, in turn, enable transistors 419, 421, 423 and 425 to load the inverted state of global data I/O bus 400 onto internal subsystem data I/O bus 411. When the read input 451 is activated, transistors 427 and 429 are turned on. In turn, transistors 431 and 433 are enabled and the inverted state of data bus 411 is loaded onto data bus 400. Inverters 435, 437, 439 and 441 are connected to form holding latches and hold the state of data bus 411 when it is not being actively driven. Inverters 437 and 441 are designed to be weak devices which are capable of being overdriven.

In comparison to the prior art methods for testing internally embedded busses, the addressable serial test system offers at least a 2 to 1 cost advantage based on a significant reduction of complexity. This results from the 2 or 3 to 1 increase in latch complexity required to enable the prior to thread together the storage elements in the form of a shift register.

In conclusion, an improved structure for testing digital circuits that is less complex, and can operate at a higher speed has been detailed.

What is claimed is:

1. An addressable serial test system comprising:
    a serial shift register having a clock input, a serial data input, and a plurality of parallel outputs, wherein a data stream is clocked into the serial shift register via a shift clock signal and reflected at the plurality of outputs;
    an address decoder having a plurality of inputs connected to a portion of the plurality of outputs of the serial shift register, and an output for providing a selection signal dependent on the data stream reflected at the portion of the plurality of outputs of the serial shift register;
    a system clock for generating a system clock signal;
    a storage element having a clock input coupled to the system clock signal, a data input residing at a logical state, an output, a load input coupled to the selection signal provided by the address decoder, and a test data input coupled to another portion of the plurality of outputs of the serial shift register, wherein the output is alternately forced to another logical state by the selection signal dependent on the data stream present at the test data input, and forced to the logical state of the data input by the system clock.

2. A system in accordance with claim 1, wherein the serial shift register further comprises a serial data output, and a plurality of parallel inputs, wherein another input data stream is clocked into the serial shift register via the shift clock signal and reflected at the portion of the plurality of outputs;
    wherein the output of the address decoder provides the selection signal dependent on the another input data stream reflected at the portion of the plurality of outputs of the serial shift register;
    and wherein the output of the storage element is gated to one of the plurality of parallel inputs of the serial shift register dependent on the selection signal provided by the address decoder.

3. A system in accordance with claim 1, further comprising:
    a test clock generator for providing a test clock signal;
    a clock selection circuit having a select input, the clock selection circuit coupled to the test clock generator for receiving the test clock signal and the system clock for receiving the system clock signal, the clock selection circuit for providing the shift clock signal alternately dependent on the test clock signal and the system clock signal selectable at the select input.

4. An addressable serial test system comprising:
    a serial shift register having a scan input, a scan output, and a clock input, wherein the serial shift register is arranged into an address section having a plurality of outputs, and a data section concatenated in series to the address section, the data section having a plurality of outputs, wherein responsive to a shift clock signal provided to the clock input, a data stream is clocked into the data section and the address section from the scan input;
    an address decoder having inputs coupled to a portion of the plurality of outputs of the address section of the serial shift register, and an output providing a selection signal dependent on the data stream clocked into the address section of the serial shift register;
    a system clock for providing a system clock signal; and
    a storage element having a clock input coupled to the system clock and receiving the system clock signal, a data input residing at a logical state, an output, a load input coupled to the output of the address decoder, and a test data input coupled to one of the plurality of outputs of the data section of the serial shift register, wherein the output is alternately forced to another logical state, dependent on the data stream present at the test data input by the selection signal, and forced to the logical state of the data input by the system clock.

5. A system in accordance with claim 4, further comprising:
    a test clock generator for providing a test clock signal;
    a clock selection circuit having a select input, the clock selection circuit coupled to the test clock generator for receiving the test clock signal and the system clock for receiving the system clock signal, the clock selection circuit for providing the shift clock signal alternately dependent on the test clock signal and the system clock signal selectable at the select input.

6. An addressable serial test system comprising:
    a serial shift register having a scan input, a scan output, and a clock input, wherein the serial shift register is arranged into an address section having a plurality of outputs, and a data section concatenated in series to the address section, the data section having a plurality of outputs, wherein responsive to a shift clock signal provided to the clock input, a data stream is clocked into the data section and the address section from the scan input;

a plurality of address decoders each having inputs coupled to a portion of the plurality of outputs of the address section of the serial shift register, and each having an output providing a selection signal dependent on the data stream clocked into the address section of the serial shift register;

a system clock for providing a system clock signal; and a plurality of storage elements each having a clock input coupled to the system clock and receiving the system clock signal, a data input residing at a logical state, an output, a load input coupled to the output of an associated address decoder, and a test data input coupled to an associated one of the plurality of outputs of the data section of the serial shift register, wherein each of the outputs is alternately forced to another logical state, dependent on the data stream present at the associated test data input by the associated selection signal, and forced to the logical state of the data input by the system clock.

7. A system in accordance with claim 6, further comprising:

a test clock generator for providing a test clock signal;

a clock selection circuit having a select input, the clock selection circuit coupled to the test clock generator for receiving the test clock signal and the system clock for receiving the system clock signal, the clock selection circuit for providing the shift clock signal alternately dependent on the test clock signal and the system clock signal selectable at the select input.

* * * * *